(12) United States Patent
Tutuc et al.

(10) Patent No.: US 10,950,487 B2
(45) Date of Patent: Mar. 16, 2021

(54) METHOD FOR FORMING AN ALIGNMENT MARK

(71) Applicant: Infineon Technologies Austria AG, Villach (AT)

(72) Inventors: Daniel Tutuc, St. Niklas an der Drau (AT); Hans Weber, Bayerisch Gmain (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 16/014,506

(22) Filed: Jun. 21, 2018

(65) Prior Publication Data
US 2018/0374741 A1 Dec. 27, 2018

(30) Foreign Application Priority Data
Jun. 22, 2017 (DE) .......................... 102017113864.1

(51) Int. Cl.
*H01L 21/762* (2006.01)
*H01L 29/06* (2006.01)
(Continued)

(52) U.S. Cl.
CPC .... *H01L 21/76224* (2013.01); *H01L 21/0243* (2013.01); *H01L 21/02381* (2013.01); *H01L 21/02436* (2013.01); *H01L 21/02494* (2013.01); *H01L 21/02518* (2013.01); *H01L 21/76229* (2013.01); *H01L 21/78* (2013.01); *H01L 23/544* (2013.01); *H01L 29/0634* (2013.01); *H01L 29/1095* (2013.01); *H01L 29/4236* (2013.01);
(Continued)

(58) Field of Classification Search
CPC ....... H01L 21/76224; H01L 21/02104–02697; H01L 23/544; H01L 2223/54426; H01L 2223/544–54493; H01L 21/76229; H01L 21/762; G03F 9/70–7084
See application file for complete search history.

(56) References Cited

U.S. PATENT DOCUMENTS 6,303,460 B1 * 10/2001 Iwamatsu ......... H01L 21/76229
257/E21.548
6,440,816 B1 * 8/2002 Farrow ............. H01L 21/76229
257/797
(Continued)

FOREIGN PATENT DOCUMENTS

DE 102016112970 B3 8/2017

*Primary Examiner* — Matthew C Landau
*Assistant Examiner* — Eric K Ashbahian
(74) *Attorney, Agent, or Firm* — Murphy, Bilak & Homiller, PLLC (57) ABSTRACT

Disclosed is a method. The method includes forming a trench structure with at least one first trench in a first section of a semiconductor body; forming a second trench that is wider than the first trench in a second section of the semiconductor body; and forming a semiconductor layer on a surface of the semiconductor body in the first section and the second section and in the at least one first trench and the second trench such that the semiconductor layer has a substantially planar surface above the first section and a residual trench remains above the second section. Forming the semiconductor layer includes forming a first epitaxial layer in a first epitaxial growth process and a second epitaxial layer on top of the first epitaxial layer in a second epitaxial growth process.

20 Claims, 10 Drawing Sheets (51) Int. Cl.

| | |
|---|---|
| *H01L 29/10* | (2006.01) |
| *H01L 29/78* | (2006.01) |
| *H01L 21/78* | (2006.01) |
| *H01L 23/544* | (2006.01) |
| *H01L 29/423* | (2006.01) |
| *H01L 21/02* | (2006.01) |
| *H01L 29/417* | (2006.01) |

(52) U.S. Cl.
CPC ...... *H01L 29/7802* (2013.01); *H01L 29/7813* (2013.01); *H01L 21/02658* (2013.01); *H01L 29/41766* (2013.01); *H01L 2223/54426* (2013.01)

(56) References Cited

U.S. PATENT DOCUMENTS

| | | | |
|---|---|---|---|
| 8,796,048 B1* | 8/2014 | Thompson | H01L 21/67253 438/14 |
| 2003/0219933 A1* | 11/2003 | Yamauchi | H01L 29/0634 438/156 |
| 2009/0273102 A1* | 11/2009 | Nogami | H01L 23/544 257/797 |
| 2014/0110779 A1* | 4/2014 | Tamaki | H01L 29/66727 257/330 |
| 2015/0311290 A1* | 10/2015 | Kang | H01L 21/02378 257/77 |
| 2017/0098616 A1* | 4/2017 | Kaltalioglu | H01L 23/562 |
| 2017/0229579 A1* | 8/2017 | Cheng | H01L 29/66795 |

* cited by examiner

METHOD FOR FORMING AN ALIGNMENT MARK

TECHNICAL FIELD

This disclosure in general relates to an epitaxial process, in particular forming an alignment mark in an epitaxial layer.

BACKGROUND

Forming semiconductor devices may include forming two or more semiconductor layers one above the other and processing the individual semiconductor layers. Processing of each semiconductor layer may include one or more photolithographic processes in which a mask is positioned above a surface of the respective semiconductor layer and is used to selectively expose a photo resist layer formed on the surface. The exposed photo resist layer may then be used as an implantation mask or etch mask or may be used to form such implantation mask or etch mask. An alignment mark may be used to align the mask used for processing a second semiconductor layer formed on a first semiconductor layer to patterns formed in the first semiconductor layer. The alignment mark is a structure or pattern in the second semiconductor layer that results from a corresponding structure or pattern in the first semiconductor layer.

There is a need for an efficient multistep epitaxial process.

SUMMARY

One example relates to a method. The method includes forming a trench structure with at least one first trench in a first section of a semiconductor body, forming a second trench that is wider than the first trench in a second section of the semiconductor body, and forming a semiconductor layer on a surface of the semiconductor body in the first section and the second section and in the at least one first trench and the second trench such that the semiconductor layer has a substantially planar surface above the first section and a residual trench remains above the second section. Forming the semiconductor layer includes forming a first epitaxial layer in a first epitaxial growth process and a second epitaxial layer on top of the first epitaxial layer in a second epitaxial growth process.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1A:
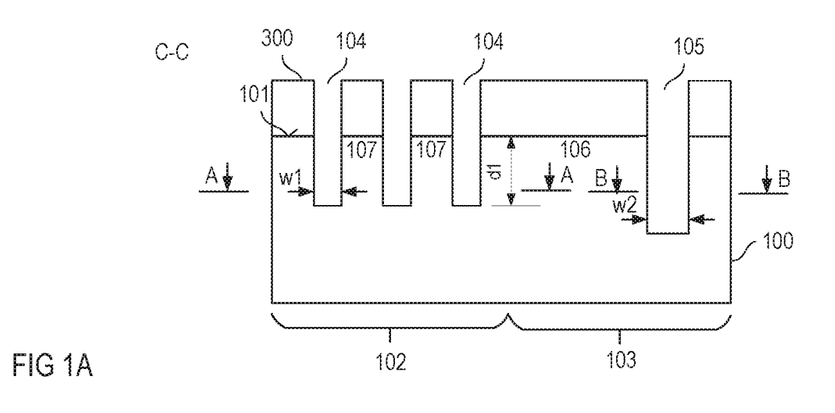
FIGS. 1A and 1B illustrates one example of a method for forming an alignment mark in a epitaxial layer formed on top of a first section and a second section of a semiconductor body.
Figure 1B:
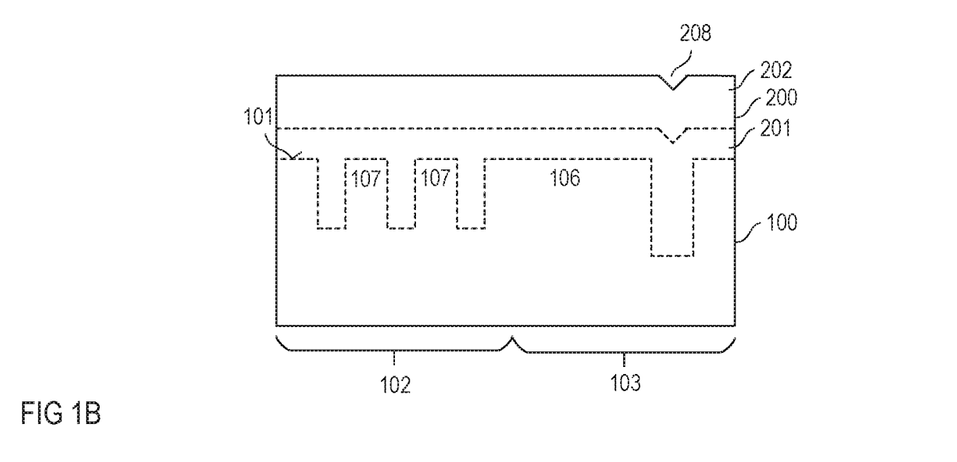

FIGS. 1A and 1B illustrate one example of a method for forming a semiconductor layer 200 on top of a semiconductor body 100. In particular, forming the semiconductor layer 200 includes forming the semiconductor layer 200 such that it completely fills a trench structure with at least one first trench 104 formed in a first section 102 of the semiconductor body 100 and has a substantially planar surface above this trench structure. Further, forming the semiconductor layer 200 includes forming the semiconductor layer 200 such that a second trench 105 formed in a second section 103 of the semiconductor body 100 is reproduced. "Reproduced" in this context means that a residual trench 208 remains in the semiconductor layer 200 above the second trench 105, so that a position of the residual trench 208 is defined by the position of the second trench 105 in the semiconductor body 100 and so that the residual trench 208 is aligned with the second trench 105. The residual trench 208 may therefore be used as an alignment mark, which is explained in further detail herein below. Thus, residual trench 208 is also referred to as alignment mark in the following.

Referring to FIG. 1A, the semiconductor body 100, before forming the semiconductor layer 200, includes the trench structure with the at least one first trench 104 in the first section 102 of the semiconductor body 100 and the second trench 105 in the second section 103 of the semiconductor body 100. Just for the purpose of illustration, the trench structure includes several first trenches 104 in the example shown in FIG. 1A. The second section 103 adjoins the first section 102 in a lateral direction of the semiconductor body 100, wherein the lateral direction is a direction parallel to a first surface 101 of the semiconductor body 100. The first trenches 104 and the second trench 105 extend from the first surface 101 in a vertical direction into the semiconductor body 100. The "vertical direction" is a direction perpendicular to the first surface 101. The first trenches 104 and the second trench 105 may be formed by a conventional trench etching process such as, for example, an anisotropic etching process. The first trenches 104 in the first section 102 and the second trench 105 in the second section 103 may be formed by the same etching process. This etching process may include forming an etch mask 300 on top of the first surface 101. The etch mask 300 includes openings that define positions and lateral dimensions of the first trenches 104 and the second trench 105. "Lateral dimensions" are dimensions in lateral directions, the latter being directions parallel to the first surface 101. Via these openings of the etch mask 300 an etching agent is brought in contact with the semiconductor body 100 during the etching process, so as to etch the first trenches 104 and the second trench 105.

According to one example, the semiconductor body 100 is a monocrystalline silicone (Si) semiconductor body. The etching process includes, for example, at least one of a dry etching process or plasma etching process.

In the following "width" of one of the first trenches 104 and the second trench 105 defines the shortest lateral dimension of the respective trench. In FIG. 1A, w1 denotes the width of the first trenches 104, and w2 denotes the width of the second trench 105. The width w1 of the first trenches 104 is referred to as first width and the width w2 of the second trench 105 is referred to as second width in the following. The second trench 105 is wider than the first trenches 104 so that the first width w1 is smaller than the second width w2. According to one example, a ratio w2/w1 between the second width w2 and the first width w1 is selected from a range of between 1.5 and 3, in particular between 1.9 and 2.5. The first width w1, for example, is between 1 micrometers (μm) and 7 micrometers, in particular between 3 micrometers and 5 micrometers. An aspect ratio of the first trenches 104, which is the ratio d1/w1 between a depth d1 of the trenches 104 and the first width w1 is, for example, between 1.5:1 and 5:1, in particular between 2:1 and 4:1. The "depth d1" is the dimension in the vertical direction, which is a direction perpendicular to the first surface 101.

According to one example, the second trench 105 is deeper than the first trench 104, that is, the second trench 105 extends farther from the first surface 101 into the semiconductor body 100 from the first surface 101 than the second trenches 104. Such deeper second trench 105 can be obtained by etching the first trenches 104 and the second trench 105 in the same etching process. The opening in the etch mask 300 that defines the second trench 105 is wider than respective openings in the etch mask 300 that the first trenches 104. The wider opening in the etch mask 300 may have the effect that in the etching process the wider second trench 105 is etched faster than the narrower first trenches 104 so that at the end of the etching process the second trench 105 extends deeper into the semiconductor body 100 than the first trench 104.

A semiconductor region between the trench structure with the first trenches 104 and the second trench 105 is referred to as first mesa region 106 in the following. A surface of this first mesa region 106 forms a part of the first surface 101 of the semiconductor body 100. Further, Semiconductor regions between the first trenches 104 of the trench structure are referred to as second mesa regions in the following. Surfaces of these second mesa regions 107 form other parts of the first surface 101 of the semiconductor body 100. It should be noted that the first surface 101 of the semiconductor body 100 is defined by those surface regions outside the trenches 104, 105. The surface of one mesa region 106, 107 is a section of the surface of the semiconductor body 100 and is located between the two trenches that define the respective mesa region. In the following the general term "mesa region" denotes any one of the first and second mesa regions 106, 107. A width of the first mesa regions 107 is, for example, between 0.5 times and two times the first width, that is, between 0.5·w1 and 2·w1, or between 0.5 micrometers and 7 micrometers.

FIG. 1B shows the semiconductor arrangement after forming the semiconductor layer 200 on top of the semiconductor body 100. Forming the semiconductor layer 100 includes forming a first epitaxial layer 201 on the semiconductor layer 100, and forming a second epitaxial layer 202 on the first epitaxial layer 201. The semiconductor arrangement with the semiconductor body 100 and the semiconductor layer 200 shown in FIG. 1B is monocrystalline semiconductor arrangement. That is, based on the crystalline structure of the semiconductor arrangement the semiconductor body 100 and the semiconductor layer 200 with the two epitaxial layers 201, 202 cannot be detected. In other words, there is no visible border or interface between the semiconductor body 100 and the epitaxial layers 201, 202. Nevertheless, for the purpose of illustration and explanation, a border between the semiconductor body 100 and the semiconductor layer 200 and between the two epitaxial layers 201, 202 of the semiconductor layer 200 are illustrated in dashed lines in FIG. 1B.

Referring to FIG. 1B, forming the first epitaxial layer 201 includes forming the first epitaxial layer 201 all over the semiconductor body 100, that is, on bottoms and sidewalls of the first trenches 104, on a bottom and sidewalls of the second trench 105, and on the mesa regions 106, 107. In particular, forming the first epitaxial layer 201 includes forming the first epitaxial layer 201 such that it completely fills the first trenches 104 and has a substantially planar surface above the first section 102 of the semiconductor body 100. "Substantially planar", according to one example, means that a distance, in the vertical direction, between a position of the lowest point and a position of the highest point in the surface is less than 15%, less than 10%, or less than 5% of the depth d1 of the first trenches 104. The "depth" of the first trenches 104 is the dimension of the first trenches 104 in the vertical direction of the semiconductor body 100 before forming the first epitaxial layer 201. "Substantially planar" may include that the distance, in the vertical direction, between the position of the lowest point and the position of the highest point is less than 1 micrometer. The second trench 105 is reproduced by the first epitaxial layer 201, that is, there is a residual trench in the first epitaxial layer 201 above the former second trench 105. The second epitaxial layer 202 is formed such that it essentially grows in the vertical direction, thereby increasing a thickness of the semiconductor layer 200 above the first section 102 and reproducing the residual trench in the first epitaxial layer 201. Reproducing the residual trench in first epitaxial layer 201 by the second epitaxial layer 202 forms the alignment mark 208. Specific examples of how the first epitaxial layer 201 and the second epitaxial layer 202 may be formed are explained herein further below.

According to one example, as shown in FIG. 1A, the first and second trenches 104, 105, essentially, have vertical sidewalls, that is, sidewalls perpendicular to the first surface 101. Further, bottoms of these first and second trenches 104, 105 may, essentially, be parallel to the first surface 101 of the semiconductor body 100. This type of trenches may be referred to as U-shaped trenches. According to one example, the semiconductor body 100 is a monocrystalline silicon semiconductor body 100 with a crystal orientation such that the first surface 101 is in a {100} crystal plane of the crystal lattice, the bottoms of the trenches are in a {100} crystal plane, and the sidewalls at least of the first trenches 104 are in {010} crystal planes.

According to one example, as shown in FIG. 1B, the residual trench 208 that forms the alignment mark has a shape different from the shape of the second trench 105. According to one example, the residual trench has a V-shape, that is, a shape with two inclined sidewalls that meet at a bottom of the trench 208.

Figure 2:
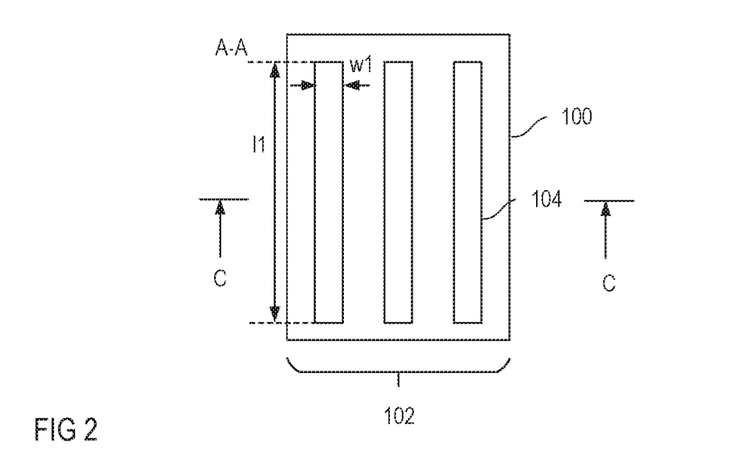
FIG. 2 shows one example of a top view of the first section of the semiconductor body.

According to one example shown in FIG. 2, the first trenches 104 are elongated trenches. FIG. 2 shows a horizontal cross sectional view of the second section 102 of the semiconductor body 100. Just for the purpose of illustration, three first trenches 104 are illustrated in FIG. 2. "Elongated" means that a length l1 of the first trenches 104 is significantly greater than the first width w1. According to one example, the length l1 is at least 10 times, at least 100 times, at least 1,000 times, or at least 10,000 times the first width w1.

Figure 3A:
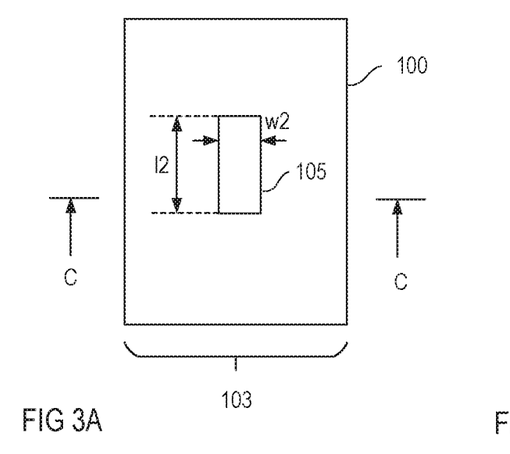
FIGS. 3A to 3D show different examples of top views of the second section of the semiconductor body.
Figure 3B:
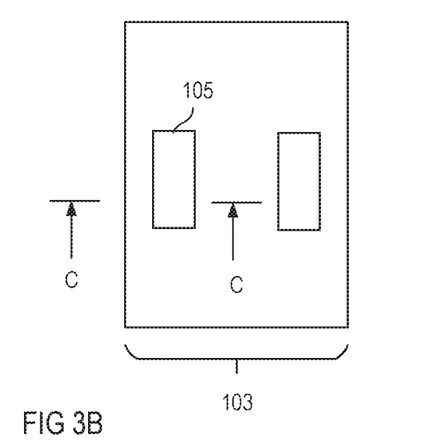
Figure 3C:
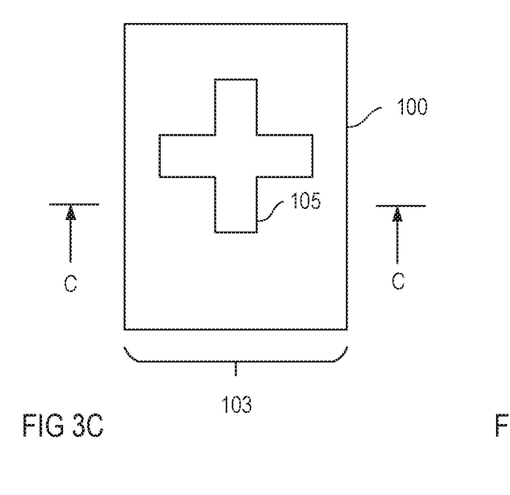
Figure 3D:
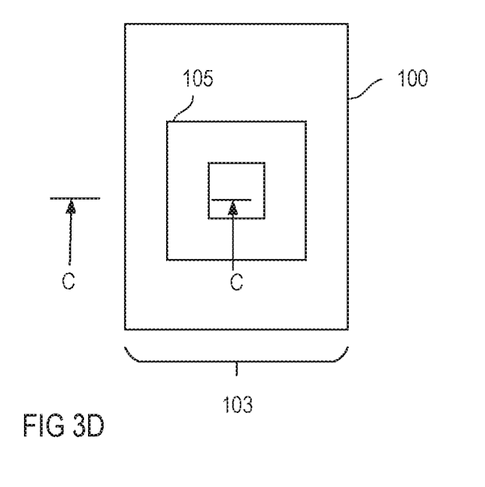

FIGS. 3A to 3D illustrate different examples of how the second trench 105 may be implemented. Each of these FIGS. 3A to 3D illustrates a horizontal cross sectional view of the semiconductor body 100 in the second section 103. According to one example shown in FIG. 3A, the second trench 105 is a single trench with a length l2 greater than the second width w2. Referring to FIG. 3B, two (as shown) or more (not shown) second trenches 105 may be formed in the second section 103. In the example shown in FIG. 3B, these trenches 105 are essentially parallel. According to another example shown in FIG. 3C, the second trench 105 is cross-shaped. According to yet another example shown in FIG. 3D, the second trench 105 is ring-shaped. According to one example, the second trench 105 in each of the examples shown in FIGS. 3A to 3D is orientated such that at least two opposing sidewalls are in {010} crystal planes of the crystal lattice of the semiconductor body 100.

The semiconductor body 100 is only schematically illustrated in FIGS. 1A and 1B. According to one example shown in FIG. 4, the semiconductor body 100 includes a semiconductor substrate 110 and a first epitaxial layer 120 grown on the substrate 110. In this example, the first trenches 104 and the second trench 105 are formed in the first epitaxial layer 120.

Figure 5:
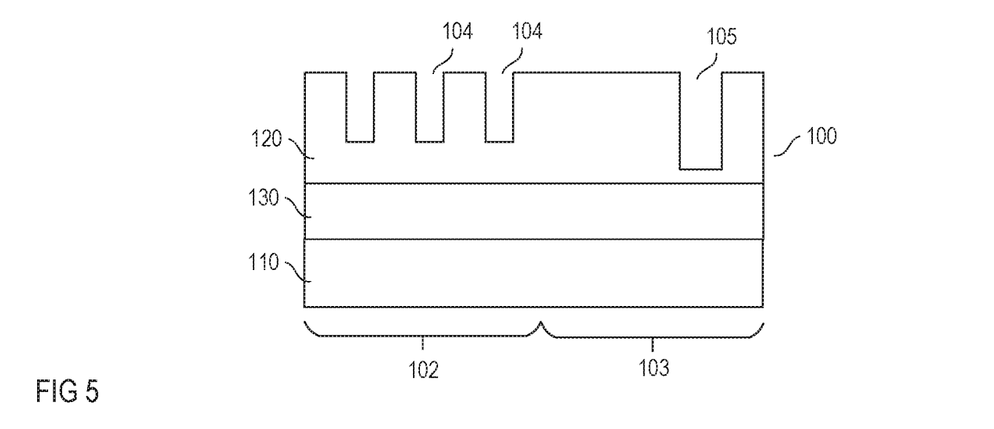
FIG. 5 shows one example a semiconductor body that includes a semiconductor substrate and two epitaxial layers formed one above the other on top of the substrate.

According to another example shown in FIG. 5, the semiconductor body 100 includes the substrate 110 and the first epitaxial layer 120 with the first trenches 104 and the second trench 105, and a second epitaxial layer 130 between the substrate 110 and the first epitaxial layer 120. The second epitaxial layer 130 is grown on the substrate 110, and the first epitaxial layer 120 is grown on the second epitaxial layer 130. According to one example, the second epitaxial layer 130 is formed to have a higher basic doping concentration than the first epitaxial layer 120. According to one example, the "basic doping concentration" is an in-situ doping concentration formed during the epitaxial growth process. According to one example, the first epitaxial layer 120 is non-doped, that is, a basic doping concentration is less than $1E14\ cm^{-3}$ ($1 \cdot 10^{14}\ cm^{-3}$). A doping concentration of the second epitaxial layer 130 is, for example, selected from a range of between $5E15\ cm^{-3}$ and $1E17\ cm^{-3}$. According to one example, a basic doping concentration of the semiconductor substrate 110 is higher than the basic doping concentration of each of the first epitaxial layer 120 and the second epitaxial layer 130. According to one example, a basic doping concentration of the semiconductor substrate 110 is selected from a range of between $1E18\ cm^{-3}$ and $1E20\ cm^{-3}$.

Figure 6:
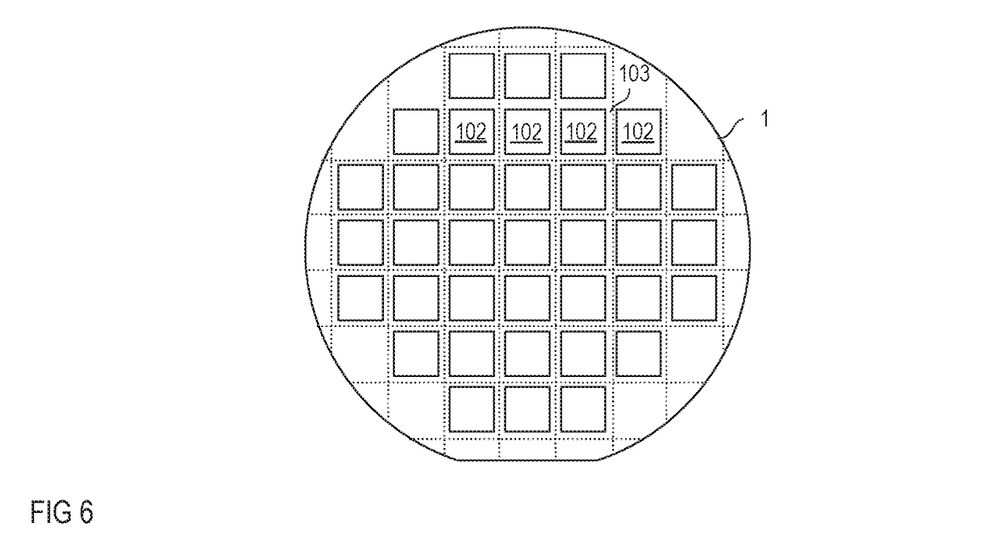
FIG. 6 illustrates a semiconductor wafer with a plurality of semiconductor bodies.

FIGS. 1A, 2, 3A to 3D, 4 and 5 each schematically illustrate only one section of the semiconductor body 100. The semiconductor body 100 can be part of a semiconductor wafer that includes a plurality of substantially identical semiconductor bodies (which may also be referred to as semiconductor chips or semiconductors dies). FIG. 6 schematically illustrates a top view of a semiconductor wafer 100 that includes a plurality of semiconductor bodies of the type explained before. Dotted lines shown in FIG. 6 illustrate those lines along which the wafer 1 can be separated after the processing in order to obtain a plurality of single semiconductor dies. According to one example, those cutting lines go through the second sections 103 so that at least parts of the second sections 103 are removed when the wafer 1 is cut into pieces. Those second sections 103 may also be referred to as kerf.

Figure 4:
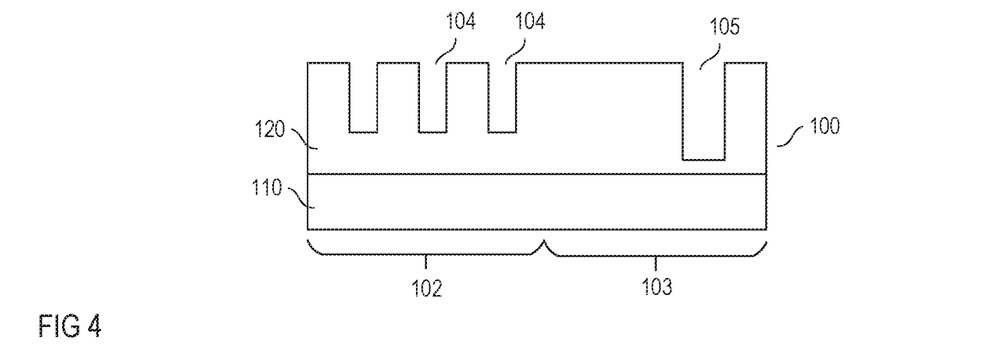
FIG. 4 shows one example a semiconductor body that includes a semiconductor substrate and an epitaxial layer formed on top of the substrate.

Although the figures explained before and in the following show only one section of one semiconductor body 100 during processing, it should be noted that process steps and process sequences explained with reference to these figures can be applied to a semiconductor wafer 1 that includes a plurality of semiconductor bodies 100. The individual process steps and process sequences are applied to the individual semiconductor bodies 100 included in the water 1 at once. In the following, the term "semiconductor body" is used to designate a semiconductor body 100 in a state as shown in FIG. 1A, 4 or 5, that is, before the semiconductor layer 200 is formed, but also during the manufacturing process. Equivalently, the term "wafer" is used to designate the wafer in the state as shown in FIG. 6, that is, before the semiconductor layer 200 is formed, but also during the manufacturing process.

Figure 7A:
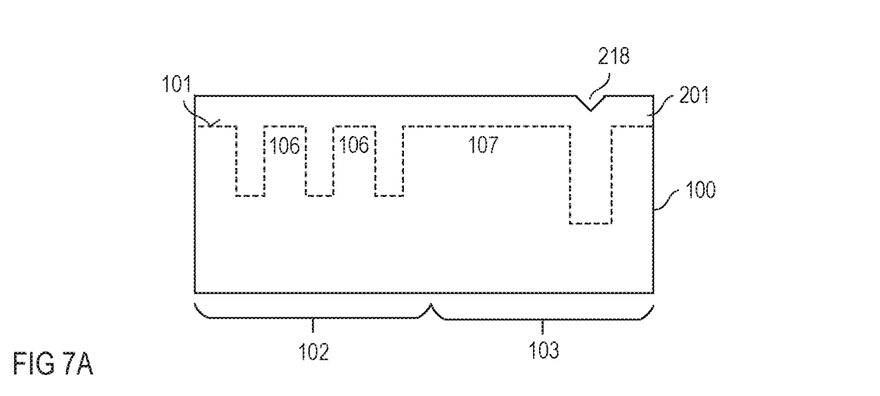
FIGS. 7A and 7B illustrate one example of a method for forming the epitaxial layer on top of the semiconductor body.
Figure 7B:
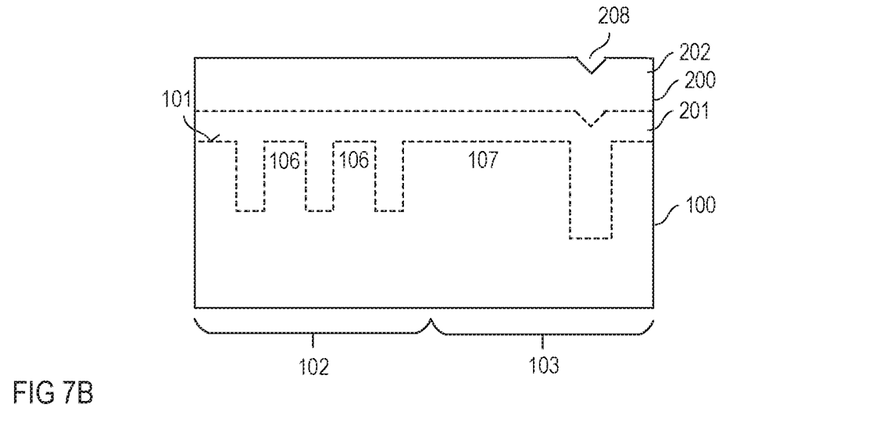

FIGS. 7A and 7B illustrate one example of a method for forming the semiconductor layer 200. In this example, forming the semiconductor layer 200 includes forming the first epitaxial layer 201 on the semiconductor body 100 in a first epitaxial growth process. According to one example, a duration of this first epitaxial growth process is such that the first epitaxial layer 201 at the end of the first epitaxial growth process completely fills the at least one first trench 104, covers the mesa regions 106, 107, and has a substantially planar surface above the first section 102, but has a residual trench 218 above the second trench 105. That is, the second trench 105 is reproduced by the first epitaxial layer 201.

In this process, the second epitaxial layer 202 is directly grown on the first epitaxial layer 201 in a second epitaxial growth process that directly succeeds the first epitaxial growth process. Forming the second epitaxial layer 202 results in an increasing thickness of the semiconductor layer 200 above the first section 102, but reproduces the residual trench 218 that is present in the first epitaxial layer 201 at the end of the first epitaxial growth process so that the alignment mark 208 is formed in a second epitaxial layer 202. "The second epitaxial growth process directly succeeding the first epitaxial growth process" may include that the wafer remains in a process chamber (process reactor) of a processing arrangement from the beginning of the first epitaxial growth process until the end of the second epitaxial growth process.

Figure 8:
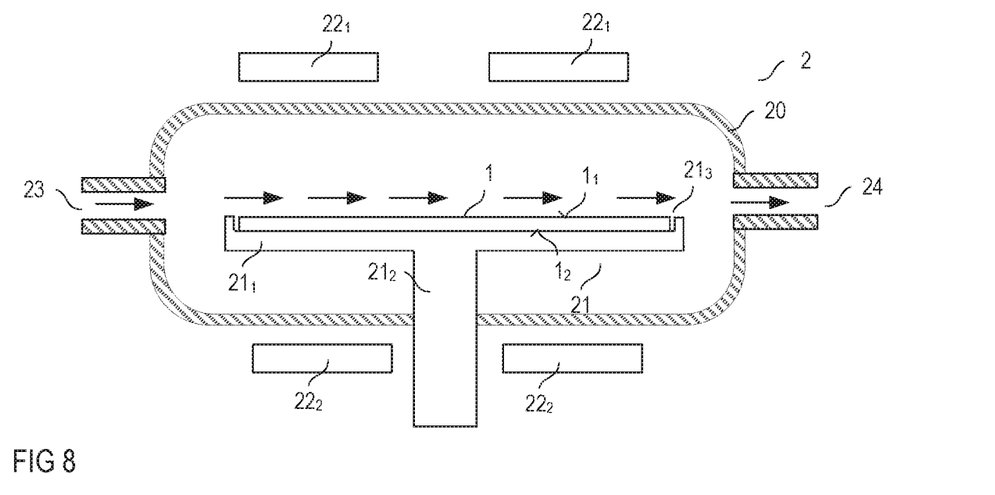
FIG. 8 shows a semiconductor wafer with a plurality of semiconductor bodies in a process chamber (process reactor) during an epitaxial process.

A sectional view of one example of a processing arrangement 2 is schematically illustrated in FIG. 8. The processing arrangement 2 includes a process chamber 20 with a support (susceptor) 21 for retaining the wafer 1 during the manufacturing process, a heating system $22_1$, $22_2$ for heating the wafer 1, at least one inlet 23 for feeding process gases into the process chamber 2, and at least one outlet 24 for removing gaseous remainders of the process from the process chamber 2. According to one example, the at least one inlet 23 and the at least one outlet 24 are arranged on opposite sides (sidewalk) of the process chamber 2 whereas a position of the at least one inlet 23 and the at least one outlet 24 relative to a position of the wafer 1 during the process is such that the process gas flows from the inlet along and laminar parallel to the first surface 1 to the outlet. At the first surface $1_1$ chemical reactions take place so that the process gas coming from the inlet 23 is different from the remainder gas going through the outlet 24. Examples of these chemical reactions are explained below.

Referring to FIG. 8, the susceptor 21 may include a susceptor plate $21_1$ for retaining the wafer 1 and a shaft $21_2$ on which the plate $21_1$ is mounted. During the process, the second surface $1_2$ of the wafer 1 may rest on a surface of the plate $21_1$. According to one example, the plate $21_1$ includes a pocket $21_3$ of about the size of the wafer 1 and the wafer rests in the pocket. According to one example, the susceptor plate $21_1$ is arranged in the chamber 20 such that the first surface 11 of the wafer is substantially aligned with the inlet 23 and the outlet 24 so that the process gas may flow along the first surface $1_1$ in a laminar fashion. A longitudinal direction (axis) of the shaft is, for example, substantially perpendicular to this surface of the plate $21_1$ and, therefore, substantially perpendicular to the first and second surface $1_1$, $1_2$ of the wafer. According to one example, the shaft $21_2$ rotates around its longitudinal direction so as to rotate the wafer $1_1$ such that each edge region of the wafer periodically passes the inlet 23. The "edge region" is a region adjoining a lateral edge of the wafer 1. Such rotation of the wafer 1 compensate for gas depletion due to epitaxial layer growth at the first $1_1$ wafer surface.

The heating system $22_1$, $22_2$ is located outside the process chamber and heats the wafer 1 through the housing of the process chamber. According to one example, the heating system includes heat lamps, such as halogen lamps, and the housing of the process chamber is transparent so that light emitted by the lamps may through the housing and heat the wafer. According to one example, the housing of the process chamber includes quartz glass.

According to one example, the process gases at least include a silicon containing precursor, and hydrogen. In the process chamber, the precursor and hydrogen react so that silicon (Si) from the precursor is deposited in solid and monocrystalline form on a first surface $1_1$ of the wafer 1. The first surface $1_1$ of the wafer is formed by the first surfaces 101 of the semiconductor bodies 100 included in the wafer 1, so that, the silicon is deposited on the first surfaces 101 of the semiconductor bodies 101. The precursor may contain chlorine. In this case, besides the solid silicon gaseous hydrochloric acid is formed from the gaseous precursor and the gaseous hydrogen.

In the example shown in FIG. 6, the heating system $22_1$, $22_2$ includes two heaters, a first heater $22_1$ facing a first surface $1_1$ of the wafer 1, and a second heater $22_2$ facing a second surface $1_2$ opposite the first surface $1_1$ of the wafer 1, whereas each of these heaters $22_1$, $22_2$ may include several heating elements.

According to one example, the heaters $22_1$, $22_2$ include halogen lamps. To reduce temperature gradients, and therefore minimize mechanical stress within the wafer 1, the first heater $22_1$ heats the first surface $1_1$ of the wafer 1 and the second heater $22_2$ heats the susceptor plate $21_1$, which may include graphite, and the second surface $1_2$ of the wafer 1.

An overall heating power provided by the heating system may be distributed to the individual heaters $22_1$, $22_2$ such that a vertical temperature gradient between the different materials of the susceptor 21 and the wafer 1 are balanced. Furthermore, the overall heating power may be distributed such that a certain temperature profile in the lateral direction of the wafer 1 is obtained. According to one example, this temperature profile is such that the temperature is substantially the same at each position of the wafer 1 during the growth process. According to one example, "substantially the same" includes a temperature difference of less than 10K, in particular less than 5K between any positions of the wafer 1. According to one example, when the wafer 1 is heated up to the process temperature, the temperature at the edge of the wafer may be higher than in the center. According to one example, the first and second heater $22_1$, $22_2$ are configured to provide substantially the same heating power, so that each of the heaters $22_1$, $22_2$ contributes substantially 50% to heating the process chamber 2 and the wafer 1, respectively.

The first epitaxial growth process that forms the first epitaxial layer 201 and the second epitaxial growth process that forms the second epitaxial layer 202 are different in that they are different in at least one of the following process parameters: temperature in the process chamber during the epitaxial growth process; flow rate of the precursor gas; flow rate of the hydrogen gas. The temperature is adjusted by the heaters $22_1$, $22_2$. According to one example, the same precursor is used in both epitaxial growth processes. According to one example, at least one of the following applies: the temperature in the first epitaxial growth process is lower than in the second epitaxial growth process; the flow rate of hydrogen in the first epitaxial growth process is lower than in the second epitaxial growth process; the flow rate of the precursor in the first epitaxial growth process is greater than in the second epitaxial growth process. According to one example, a difference between the lower temperature in the first epitaxial growth process and the higher temperature in the second epitaxial growth process is higher than 25K and less than 100K, in particular less than 40K.

The difference in the process parameters has the effect that the first epitaxial layer 201 and the second epitaxial layer 202 grow differently with regard to the respective growth rate and with regard to growth on vertical surfaces such as the sidewalls of the trenches 104, 105. Both epitaxial growth processes, however, are nonselective epitaxial growth processes. According to one example, the difference in the process parameters is such that the first epitaxial layer 201 has a higher tendency to grow on the bottom of the first and second trenches 104, 105 than on vertical surfaces and the mesa regions between the first trenches, while the second epitaxial layer 202 has the tendency to grow essentially conformally on surfaces of the semiconductor body 100.

Figure 9A:
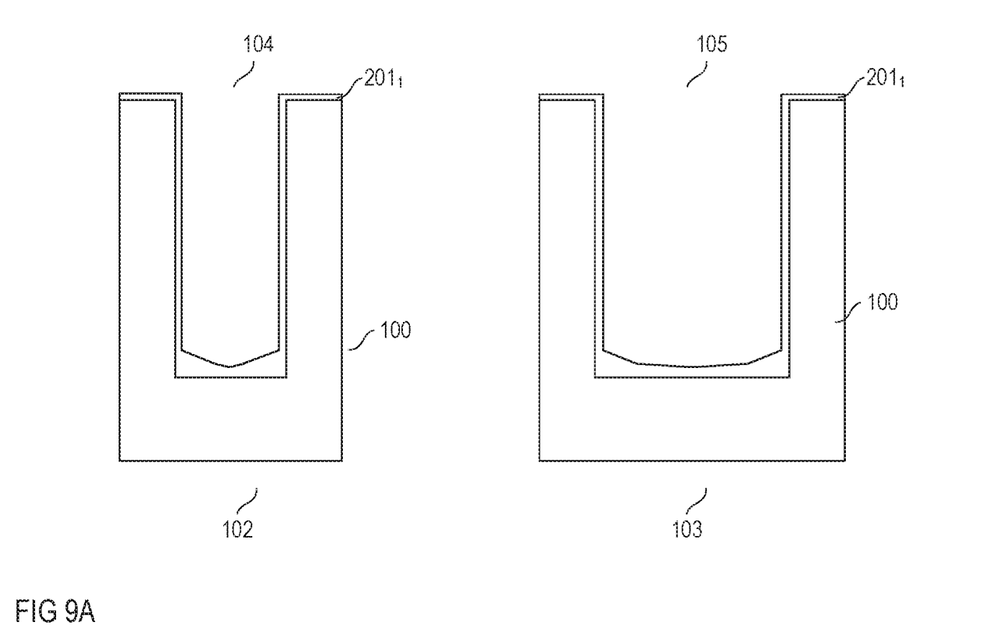
FIGS. 9A to 9D show a vertical cross sectional view of a first trench in the first section and a second trench in the second section at different stages of a first epitaxial growth process.
Figure 9B:
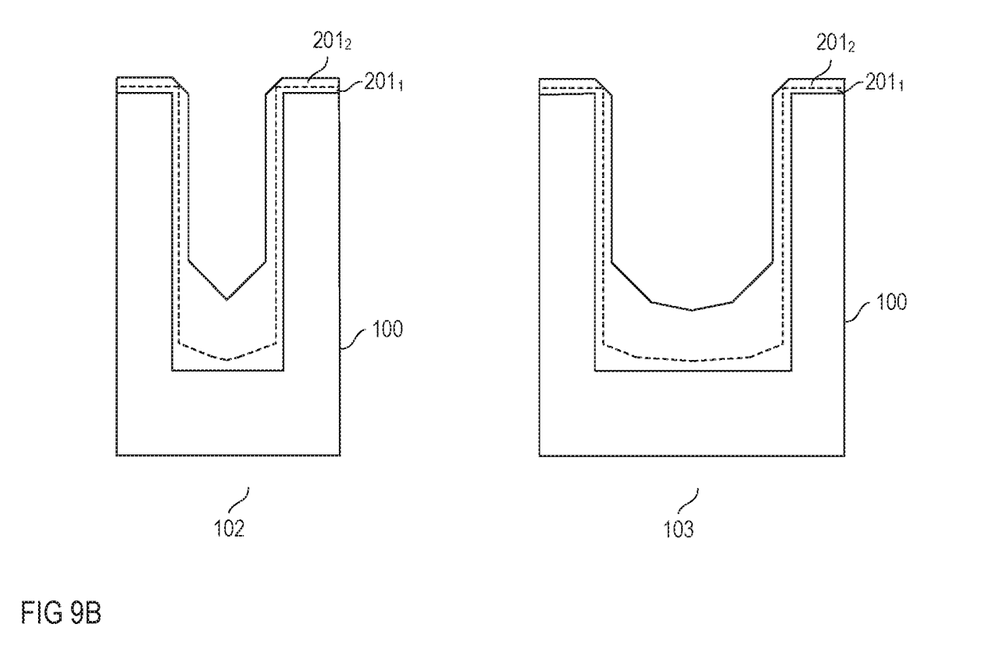
Figure 9C:
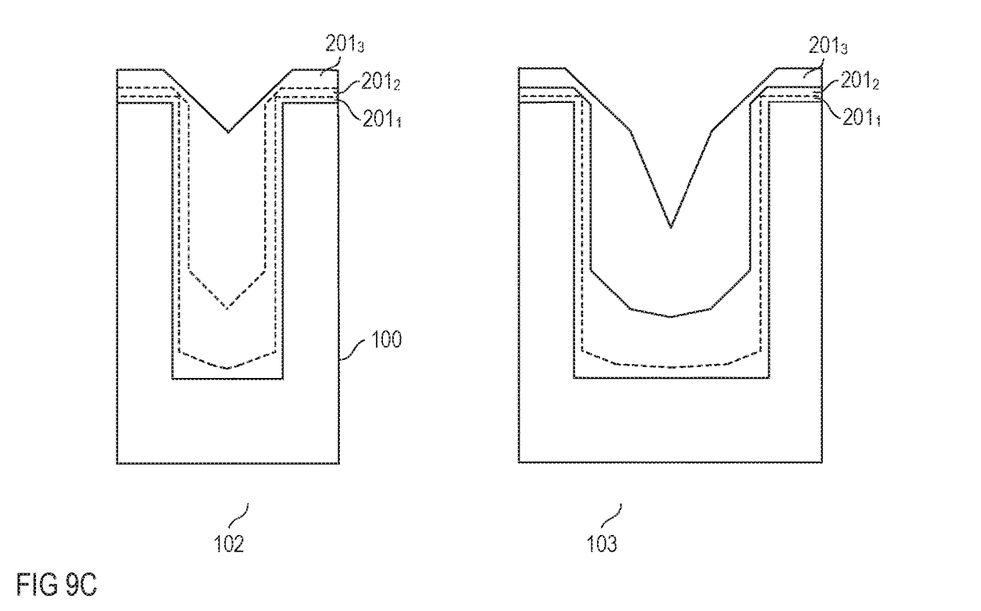
Figure 9D:
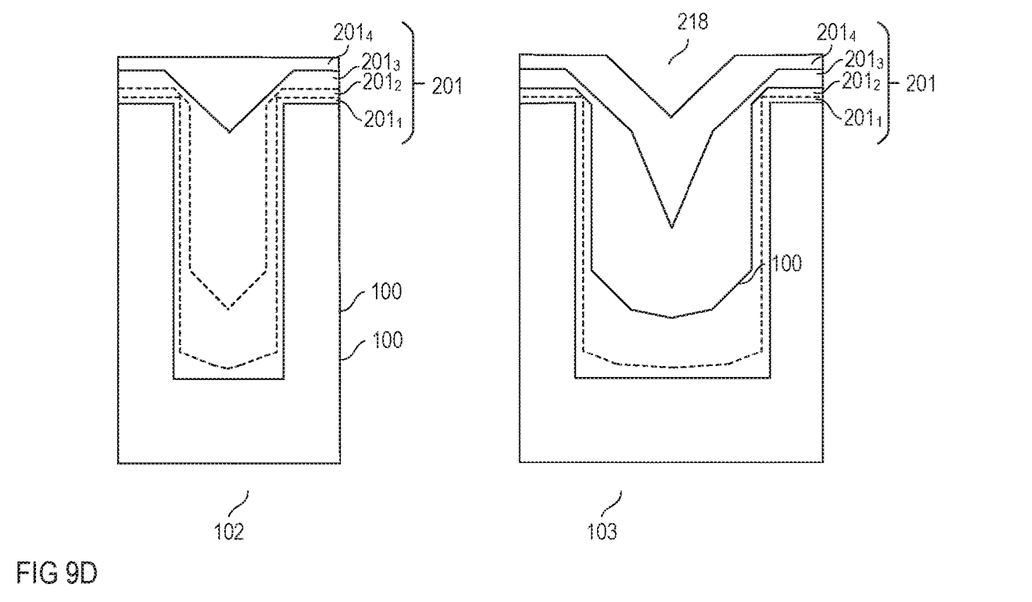

FIGS. 9A to 9D illustrate a vertical cross sectional view of one first trench 104 in the first section 102 of the semiconductor body 100 and one second trench 105 in the second section 103 of the semiconductor body 100 at different stages of the first epitaxial growth process, in which the first epitaxial layer 201 is grown. FIGS. 9A to 9D show the epitaxial layer after four stages of the epitaxial process, wherein in each of these stages one section $201_1$, $201_2$, $201_3$, $201_4$ of the first epitaxial layer 201 is grown. These sections $201_1$-$201_4$ form the first epitaxial layer 201, which is shown in FIG. 9D. The epitaxial layer 201 is a monocrystalline layer so that these sections, which may also be referred to as sublayers, are not visible in the finished epitaxial layers. In particular, there is no visible border between these sublayers.

Nevertheless, the sublayers are illustrated by dashed lines in FIGS. 9B-9D. As illustrated in FIGS. 9A-9D, semiconductor material in the first epitaxial growth has the tendency to accumulate at the bottom of the trenches, in particular, at corners between the bottom and sidewalls, more than at the sidewalls of the trenches 104, 105 and on top of the mesa region.

According to one example, a duration of the first epitaxial growth process stops when the first trenches 104 have been filled and the first epitaxial layer 201 has a substantially planar surface. By virtue of the second trench 105 being wider than the first trenches 104 there is the residual trench 218 in the second section 103 when the first epitaxial growth process stops. This residual trench 218 would be filled when the first epitaxial growth process would continue. Changing the epitaxial growth process from the first epitaxial growth process to the second epitaxial growth process, however, widely reproduces the residual trench 218 resulting in the alignment mark 208. Just for the purpose of illustration, the residual trench 218 in the example shown in FIG. 9D has a V-shape. This type of trench is widely reproduced by an epitaxial growth process, such as the second epitaxial growth process, in which semiconductor material conformally grows on surfaces of the semiconductor body. In the example shown in FIG. 9D, the surfaces on which the second epitaxial layer is grown is the surface of the first epitaxial layer 201. This first epitaxial layer is essentially planar in the first section 102 and includes the residual trench 218 in the second section 103.

Summarizing what is illustrated in FIGS. 9A to 9D, this process is suitable to produce a relatively thick epitaxial layer 200 on top of the semiconductor body 100, wherein the epitaxial layer is substantially planar above the first section 102 and reproduces the second trench 105 in order to form the alignment mark 208 above the second section 103.

According to one example, the first and second epitaxial layers 201, 202 are grown such that an overall thickness of the first and second epitaxial layers 201, 202 on top of the first surface 101, that is, on the mesa regions 106, 107, is between 0.3 times and 1.3 times the depth d1 of the first trenches 104. According to one example, the first epitaxial layer 201 is grown such that its thickness on the first surface 101 is between 0.6 times and 1.6 times the first width w1, the second epitaxial layer 202 is then grown to have a thickness that is given by the desired overall thickness minus the thickness of the first epitaxial layer 201.

Figure 10A:
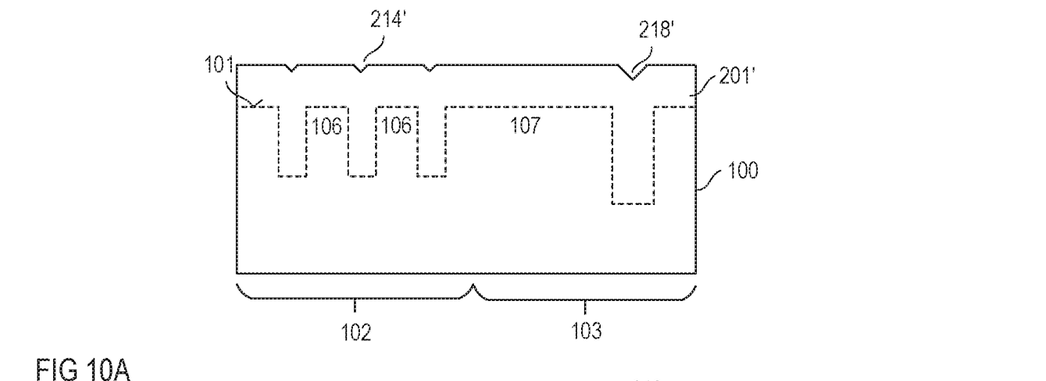
FIGS. 10A to 10C illustrate another example of a method for forming the epitaxial layer on top of the semiconductor body.
Figure 10B:
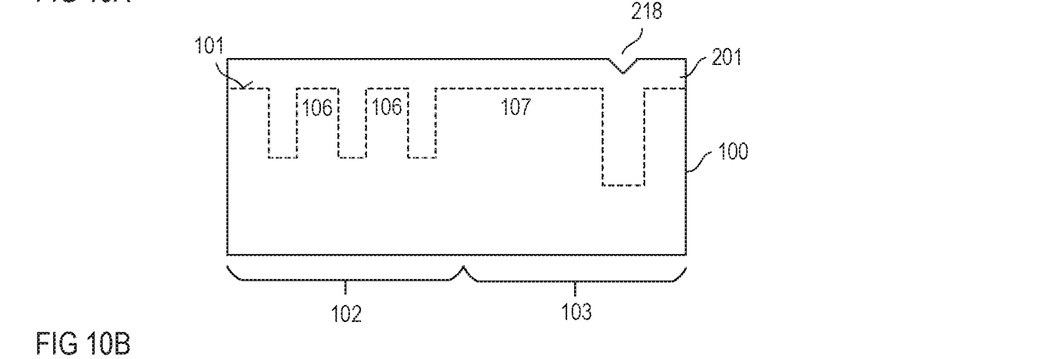
Figure 10C:
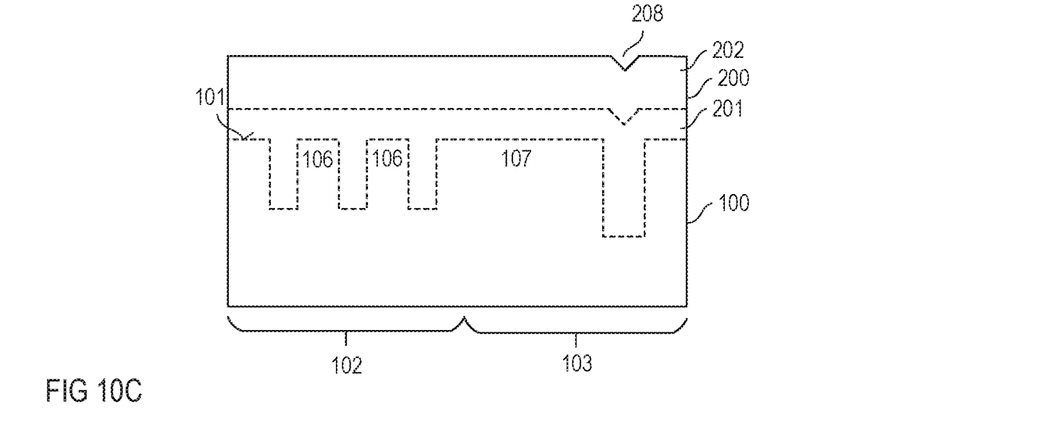

FIGS. 10A to 10C illustrate a method according to another example. Each of these figures shows a vertical cross sectional view of the semiconductor body during/after different process steps. FIG. 10A shows the semiconductor body after forming a first epitaxial layer 201' on the semiconductor body 100. In this example, the first epitaxial layer 201' is formed to have a residual trench 218' over the former second trench 105 in the second section 103 and further residual trenches 214' over the former first trenches 104 in the first section 102, wherein the further residual trenches 214' above the first section 102 are less deep than the residual trench 218 in the second section 103.

Referring to FIG. 10B, the method further includes planarizing the first epitaxial layer 201' such that the residual trenches 214' above the first section 102 are removed but the residual trench 218' essentially remains. "Essentially" means that a depth of the residual trench 218' may be reduced by the planarizing process. The planarizing process may include a chemical and/or mechanical polishing process. According to one example. the residual trench 218' above the second section 103 is covered by a protection layer (not shown) during the planarizing process. In FIG. 10B, reference character 201 denotes the first epitaxial layer with the essentially planar surface above the first section 102 after the planarizing process, and reference character 218 denotes the residual trench after the planarizing process.

Referring to FIG. 10C, the method further includes forming the second epitaxial layer 202 on the first epitaxial layer 201. The method shown in FIGS. 10A to 10C is different from the method explained with reference to FIGS. 7A and 7B in that the semiconductor arrangement has to be removed from the process chamber between the first and second epitaxial growth process. On the other hand, the same process parameters may be used in the first and second epitaxial growth process in the method illustrated in FIGS. 10A to 10C such as, for example, process parameters as explained in context with the second epitaxial growth process before.

Figure 11A:
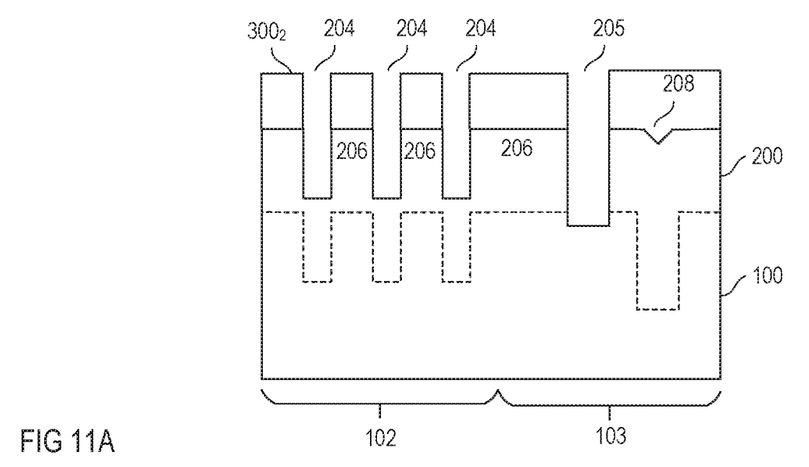
FIGS. 11A and 11B illustrate forming another epitaxial layer on top of the epitaxial layer including the alignment mark.
Figure 11B:
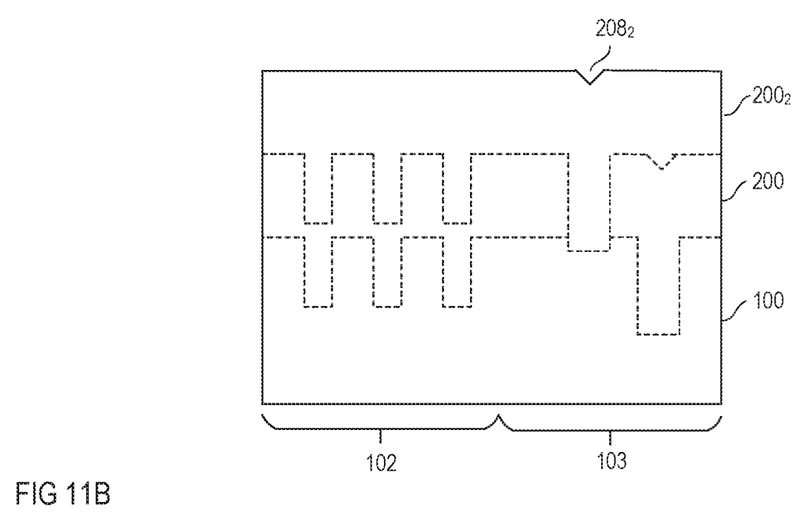

The method for forming a semiconductor layer with alignment mark on top of a trench arrangement may be repeated several times in order to form several epitaxial layer one above the other. This is illustrated in FIGS. 11A and 11B. FIG. 10A shows the semiconductor arrangement with the semiconductor body 100 and the epitaxial layer 200 after forming a trench structure with at least one first trench 204 in a first section of the semiconductor layer 200 and after forming a second trench 205 in a second section of the semiconductor layer 200. The "first section of the semiconductor layer" is a region of the semiconductor layer 200 above the first section 102 of the semiconductor body 100, and the "second section of the semiconductor layer" is a region of the semiconductor layer 200 above the second section 102 of the semiconductor body 100. Forming this trench structure in the first section and the second trench 205 in the second section may include an etching process using an etch mask. It may be desirable to produce the trench structure with the at least one first trench 204 in the semiconductor layer 200 such that it is aligned with the former trench structure in the semiconductor body. This may include that a position of the at least one first trench 204 in the semiconductor layer 200 is exactly located above a position of the at least one former first trench in the semiconductor body 100 or that there is predefined lateral offset between these positions. In the semiconductor body 100, the at least one first trench 104 and the second trench 105 cab be produced such that there is a known spatial relationship between these trenches 104, 105. In the semiconductor layer 200, the alignment mark 208 identifies the position of the first trench in the semiconductor body 100 below the semiconductor layer. Based on the position of the alignment mark 208 and based on the known spatial relationship between the second trench 105 and the at least one first trench 104 in the semiconductor body 100 the position of the at least one first trench 104 in the semiconductor body 100 can still be identified after the semiconductor layer 200 has been formed. Thus, the alignment mark 208 can be used to produce the etch mask $300_2$ such that at least one opening in the etch mask is aligned with the position of the at least one first trench in the semiconductor body 100.

FIG. 11B shows the semiconductor arrangement after forming a further semiconductor layer $200_2$ on the semiconductor layer 200. Forming the further semiconductor layer $200_2$ may include any of the processes for forming the semiconductor layer 200 explained before. In particular, forming the further semiconductor layer $200_2$ includes forming a further first semiconductor layer and a further second semiconductor layer. Referring to FIG. 11B, forming the further semiconductor layer $200_2$ includes forming a further alignment mark $208_2$ that results from the second trench 205 in the semiconductor layer 200. This further alignment mark may be used for aligning at least one first trench of a trench structure (not shown) to be produced in the further semiconductor layer $200_2$ with the former trench structure in the semiconductor body 100 and the semiconductor layer 200. According to one example, a position of the further alignment mark $208_2$ is offset in a lateral direction relative to a position of the alignment mark 208 in the semiconductor layer. The reason is that the second trench 205 in the semiconductor layer 200 that defines the position of the further alignment mark $208_2$ is produced spaced apart from the alignment mark 208 in order to avoid the alignment mark from being removed when forming the second trench 205.

Figure 12:
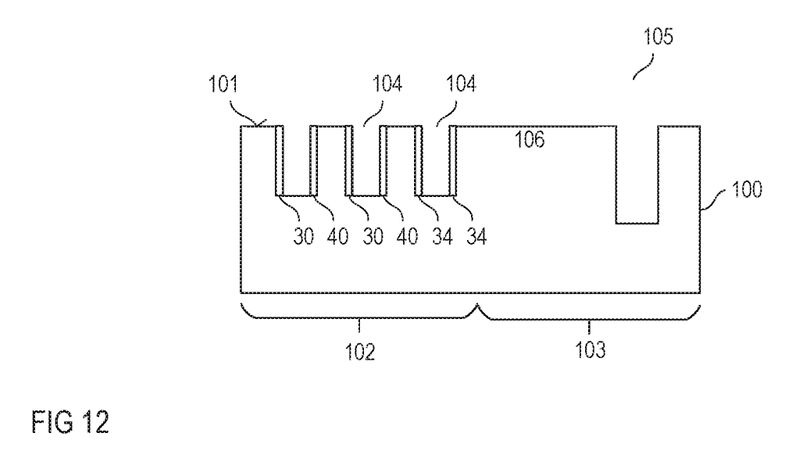
FIG. 12 illustrates the semiconductor body after implanting dopant atoms and before forming the epitaxial layer.

In each of the examples explained before, dopant atoms may be implanted into sidewalls of the first trenches 104 in the semiconductor body 100 before forming the semiconductor layer 200. This is illustrated in FIG. 12 that illustrates a vertical cross sectional view of the semiconductor body 100 after implanting dopant atoms. Implanting dopant atoms may include implanting dopant atoms of a first doping type (n or p) into first sidewalls in order to form first implanted regions 30 and implanting dopant atoms of a complementary doping type (p or n) into second sidewalls opposite the first sidewalls in order to form second implanted regions 40. This is illustrated for two trenches in FIG. 12. Alternatively, both doping atoms of the first doping type and doping atoms of the second doping type are implanted into both the first sidewall and the second sidewall to form third implanted regions 34. This is illustrated for one trench in FIG. 12.

Figure 13:
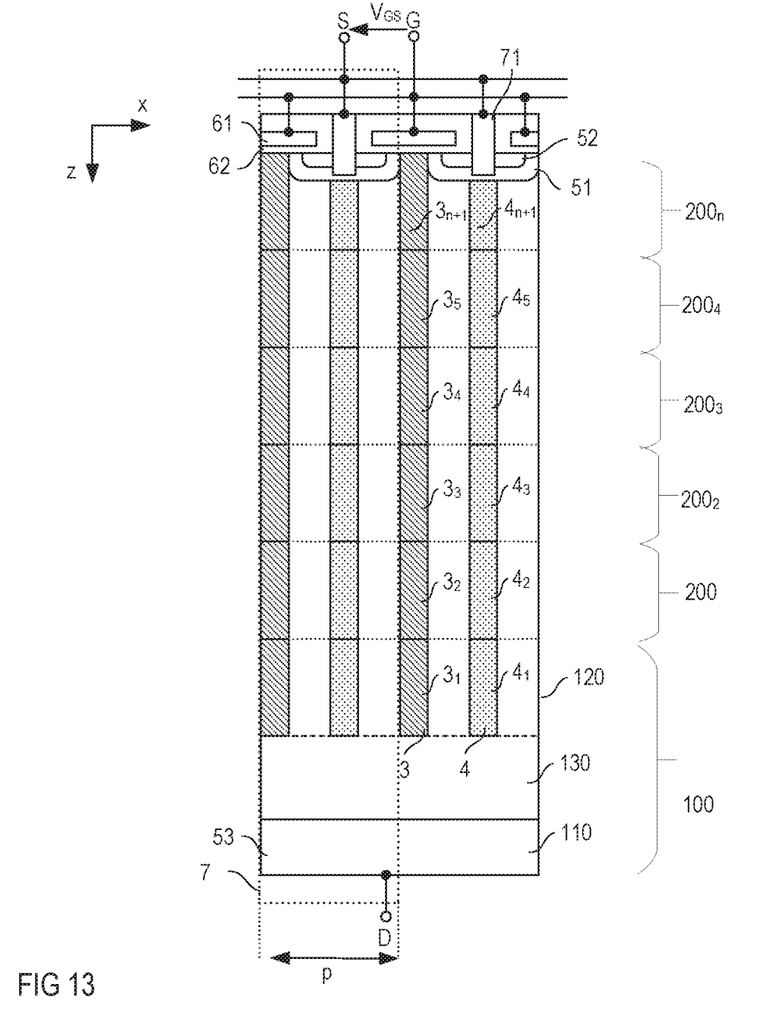
FIG. 13 shows a vertical cross sectional view of a transistor device.

Equivalently, dopant atoms may be implanted into the sidewalls of trenches of any further semiconductor layer. Referring to the above, a plurality of semiconductor layers may be formed one above the other. FIG. 13 shows one example of a superjunction semiconductor device that has been formed based on a semiconductor arrangement with a semiconductor body 100 and a plurality of semiconductor layers $200\text{-}200_{n-1}$ formed one above the other on the semiconductor body 100. Just for the purpose of illustration, the semiconductor body 100 is a semiconductor body of the type explained with FIG. 5 and includes a substrate 110, an epitaxial layer 120 in which first trenches had been formed, and a further epitaxial layer between the first epitaxial layer 120 and the substrate 110. In context with FIG. 13, the term semiconductor layer denotes the epitaxial layer 120 and any of the semiconductor layers $200\text{-}200_{n-1}$ formed one above the other on the epitaxial layer 120.

Referring to FIG. 13, each of the semiconductor layers 120, $200\text{-}200_n$ includes a plurality of doped regions $3_1\text{-}3_{n+1}$ of the first doping type (referred to as first type regions in the following) and a plurality of doped regions $4_1\text{-}4_{n+1}$ of the second doping type (referred to as second doped regions in the following). The first type regions $3_1\text{-}3_n$ may result from first implanted regions 30 as explained with reference to FIG. 12 by a diffusion process, and the second type regions $4_1\text{-}4_n$ may result from second implanted regions 40 as explained with reference by a diffusion process. Alternatively, the first type regions $3_1\text{-}3_{n+1}$ and the second type regions $4_1\text{-}4_{n+1}$ may result from third implanted regions 40 as explained with reference by a diffusion process. In the latter case, the first type dopant atoms and the second type dopant atoms are chosen to have different diffusion constants so that in the diffusion process these first type dopant atoms and the second type dopant atoms segregate so that first type regions and second type regions are formed based on the third implanted regions. The diffusion process may include an annealing process after the plurality of semiconductor layers 120, $200_2\text{-}200_n$.

In the example shown in FIG. 13, the arrangement with the semiconductor layers 120, $200\text{-}200_n$ forms a drift region of the superjunction semiconductor device. In this device, the doped first type regions $3_1\text{-}3_{n+1}$ of the individual semiconductor layers 120, $200\text{-}200_n$ are arranged one above the other in a vertical direction z of the semiconductor device and first type regions $3_1\text{-}3_{n+1}$ of adjoining semiconductor layers 120, $200\text{-}200_n$ adjoin each other so that those first type regions $3_1\text{-}3_{n+1}$ that are arranged one above the other in the vertical direction z form a contiguous first type region 3. Forming these first type regions $3_1\text{-}3_{n+1}$ and second type regions $4_1\text{-}4_{n+1}$ may be obtained by forming first trenches in the individual semiconductor layers 120, $200\text{-}200_n$ one above the other. The alignment marks explained before may help to achieve this.

The superjunction device shown in FIG. 13 is implemented as a MOSFET. In this case, the substrate 120 forms a drain region 53 that is connected to a drain node D (which is only schematically illustrated in FIG. 5A) of the MOSFET. The MOSFET may include a plurality of device cells 7, whereas two of these device cells are shown in FIG. 13. Each of these device cells includes one first type region 3 and one second type region 4. The plurality of device cells share the drain region 53 formed by the substrate 110 and the epitaxial layer 130 adjoining the substrate 110, wherein the epitaxial layer 130 forms a part of the drift region of the superjunction MOSFET.

Each device cell (transistor cell) 7 further includes a source region 52, a body region 51 separating the source region 52 from the drift region, and a gate electrode 61 dielectrically insulated from the body region 51 by a gate dielectric 62. The gate electrodes 61 of the individual device cells are electrically connected to a common gate node G, and the source and body regions 52, 51 of the individual device cells are electrically connected to a source node S via respective source electrodes 71. The second type region 4 of each device cells adjoins the body region 51, according to one example. The gate electrode 61 serves to control a conducting channel in the body region 51 between the source region 52 and the drift region, in particular, the second type region 20 of the drift region.

The body regions 51 and the source regions 52 can be formed in an uppermost semiconductor layer $200_n$ by at least one of an implantation and a diffusion process. Before this at least one implantation and diffusion process, first trenches (corresponding to the trenches 204 shown in FIG. 11A) of the uppermost semiconductor layer $200_n$ can be filled in accordance with any of the processes explained with reference to FIGS. 7A and 7B or 10A to 10C, that is, by epitaxially growing a semiconductor layer that fills the first trenches. The source and body regions 51, 52 may then be formed using at least one of an implantation and diffusion process in this semiconductor layer. The semiconductor layer $200_n$ in which the source and drain regions 51, 52 are formed may be thinner in the vertical direction than the other semiconductor layers 120, $200\text{-}200_4$. The gate dielectric 62 includes an oxide, for example, and may be formed using an oxidation or deposition process. The gate electrode 61, for example, includes one of a metal and a highly doped polycrystalline semiconductor material such as polysilicon.

The superjunction MOSFET can be an n-type MOSFET or a p-type MOSFET. In an n-type MOSFET, the source region 52, the drain region 53 and the first type region 3 of the drift region are n-type regions, and the body region 51 and the second type region 5 are p-type regions. In a p-type MOSFET, the individual device regions have a doping type complementary to the doping type of the respective device regions in the n-type MOSFET.

The superjunction MOSFET can be operated in an on-state or an off-state. In the on-state, the gate electrode 61, driven by a drive voltage $V_{GS}$ applied between the gate node G and the source node S, generates a conducting channel in the body region 51 between the source region 52 and the first type region 20 so that upon applying a voltage between the drain node D and the source node S a current can flow between the drain node D and the source node S. In the off-state, the gate electrode 61 is driven such that the conducting channel in the body region 51 is interrupted. For the purpose of explanation, it is assumed that the MOSFET is in the off-state and a voltage is applied between the drain node D and the source node S that reverse biases a pn-junction between the body region 51 and the first type region 3 and a pn-junction between the first type region 3 and the second type region 4. In this case, space charge regions expand in the first type region 3, the body region 51 and also the second type region 4, wherein the first type regions 3 and the second type regions 4 may be completely depleted. According to one example, a doping concentration of the body region 51 is high enough for the body region 51 to not be depleted completely.

In the annealing process explained above, the first type regions $3_1$-$3_{n+1}$ and the second type regions $4_1$-$4_{n+1}$ may diffuse in the lateral direction x such that first type regions and second type regions adjoin each other. According to another example, shown in FIG. 13, regions having a basic doping of the respective semiconductor layers 120, 200-200$_n$ may remain between the first type regions $3_1$-$3_{n+1}$ and the second type regions $4_1$-$4_{n+1}$. The "basic doping" is a doping the semiconductor layers 120, 200-200$_n$ have before the first type regions $3_1$-$3_{n+1}$ and the second type regions $4_1$-$4_{n+1}$ are formed.

In the semiconductor device shown in FIG. 13, the gate electrode 61 of each device cell is a planar electrode that is arranged above a surface of the layer arrangement 100. This, however, is only an example. According to another example (not shown) the gate electrode of each device cell is a trench electrode. That is, the gate electrode 61 is arranged in a trench above the first type region 3 and adjacent the body region 51 and the source region 52, and the gate electrode 61 is dielectrically insulated from these regions by the gate dielectric 62.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
    forming a trench structure with a first trench in a first section of a semiconductor body;
    forming a second trench that is wider than the first trench in a second section of the semiconductor body; and
    forming a semiconductor layer on a surface of the semiconductor body in the first section and the second section and in the first trench and the second trench, such that the semiconductor layer has a substantially planar surface above the first section and a residual trench remains above the second section,
    wherein forming the semiconductor layer comprises forming a first epitaxial layer in a first epitaxial growth process and a second epitaxial layer on top of the first epitaxial layer in a second epitaxial growth process,
    wherein the semiconductor body is a semiconductor wafer comprising a plurality of die sites and a kerf region, wherein the kerf region separates each of the die sites from one another, wherein the first trench is formed in one of the die sites, and wherein the second trench is formed in the kerf region,
    wherein the first epitaxial layer is a layer of monocrystalline semiconductor material, and
    wherein the monocrystalline semiconductor material of the first epitaxial layer completely fills the second trench.

2. The method of claim 1, wherein the second epitaxial growth process directly succeeds the first epitaxial growth process.

3. The method of claim 2, wherein the second epitaxial growth process directly succeeding the first epitaxial growth process comprises that the semiconductor body remains in a process chamber from the beginning of the first epitaxial growth process until the end of the second epitaxial growth process.

4. The method of claim 1, wherein the first epitaxial growth process and the second epitaxial growth process are different.

5. The method of claim 1, wherein the first epitaxial growth process and the second epitaxial growth process are different in at least one process parameter selected from the group consisting of: temperature; hydrogen flow rate; and precursor flow rate.

6. The method of claim 5, wherein the temperature in the first epitaxial growth process is lower than in the second epitaxial growth process.

7. The method of claim 6, wherein a temperature difference between the lower temperature in the first epitaxial growth process and the higher temperature in the second epitaxial growth process is higher than 25K and less than 100K.

8. The method of claim 7, wherein the temperature difference is less than 40K.

9. The method of claim 5, wherein the flow rate of hydrogen in the first epitaxial growth process is lower than in the second epitaxial growth process.

10. The method of claim 5, wherein the flow rate of the precursor in the first epitaxial growth process is greater than in the second epitaxial growth process.

11. The method of claim 1, wherein forming the semiconductor layer further comprises:
    planarizing the first epitaxial layer above the first section before forming the second epitaxial layer.

12. The method of claim 11, wherein planarizing the first epitaxial layer comprises forming a protection layer on a surface of the first epitaxial layer above the second section.

13. The method of claim 11, wherein planarizing the first epitaxial layer comprises at least one of a chemical polishing process and a mechanical polishing process.

14. The method of claim 1, wherein the at least one first trench and the second trench each have a U-shape.

15. The method of claim 14, wherein a bottom of the at least one first trench is in a {100} crystal plane of a crystal lattice of the semiconductor body, and wherein opposing sidewalls of the at least one first trench each are in a {010} crystal plane of the crystal lattice.

16. The method of claim 14, wherein a bottom of the second trench is in a {100} crystal plane of a crystal lattice of the semiconductor body, and wherein at least two opposing sidewalls of the second trench each are in a {010} crystal plane of the crystal lattice.

17. The method of claim 1, wherein the residual trench has V-shape.

18. The method of claim 1, wherein an overall thickness of the first and second epitaxial layers on the surface of the semiconductor body is between 0.3 times and 1.3 times a depth of the first trenches.

19. The method of claim 18, wherein a thickness of the first epitaxial layer on the surface of the semiconductor body is between 0.6 times and 1.6 times a width of the at least one first trench.

20. The method of claim 1, further comprising forming transistors in the die sites, wherein the semiconductor layer filling the first trench forms part of a superjunction structure in a drift region of the transistors in the die sites.

\* \* \* \* \*